United States Patent
Yeap et al.

(10) Patent No.: US 8,369,569 B2
(45) Date of Patent: Feb. 5, 2013

(54) METHOD AND APPARATUS FOR DETECTING NON-UNIFORM FRACTURING OF A PHOTOMASK SHAPE

(75) Inventors: Chee Peng Yeap, San Jose, CA (US); John T. Nogatch, Boulder Creek, CA (US)

(73) Assignee: Synopsys, Inc., Mountain View, CA (US)

( * ) Notice: Subject to any disclaimer, the term of this patent is extended or adjusted under 35 U.S.C. 154(b) by 1139 days.

(21) Appl. No.: 12/257,983

(22) Filed: Oct. 24, 2008

(65) Prior Publication Data

US 2009/0238467 A1  Sep. 24, 2009

Related U.S. Application Data

(60) Provisional application No. 61/038,695, filed on Mar. 21, 2008.

(51) Int. Cl.
*G06K 9/00* (2006.01)
(52) U.S. Cl. .......... 382/103; 382/203; 382/144; 716/19; 716/20
(58) Field of Classification Search .......... 382/103, 382/203, 288; 716/19, 20, 21
See application file for complete search history.

(56) References Cited

U.S. PATENT DOCUMENTS

| | | | | |
|---|---|---|---|---|
| 4,593,406 A | * | 6/1986 | Stone | 382/288 |
| 5,933,350 A | * | 8/1999 | Fujimoto et al. | 700/121 |
| 6,336,056 B1 | * | 1/2002 | Fujimoto et al. | 700/121 |
| 6,596,444 B2 | * | 7/2003 | Buck | 430/5 |
| 6,703,170 B1 | * | 3/2004 | Pindo | 430/5 |
| 6,760,640 B2 | * | 7/2004 | Suttile et al. | 700/121 |
| 6,996,450 B2 | * | 2/2006 | Suttile et al. | 700/121 |
| 2003/0224560 A1 | * | 12/2003 | Odaka et al. | 438/148 |
| 2004/0181769 A1 | | 9/2004 | Kochpatcharin et al. | |
| 2006/0238729 A1 | * | 10/2006 | Tanaka et al. | 355/53 |
| 2007/0130558 A1 | * | 6/2007 | Ivansen | 716/19 |
| 2007/0231710 A1 | * | 10/2007 | Aton et al. | 430/5 |

FOREIGN PATENT DOCUMENTS

| | | |
|---|---|---|
| JP | 2002329647 | 11/2002 |
| WO | 2007035166 A2 | 3/2007 |

* cited by examiner

*Primary Examiner* — Vu Le
*Assistant Examiner* — Aklilu Woldemariam
(74) *Attorney, Agent, or Firm* — Park, Vaughan, Fleming & Dowler LLP; Laxman Sahasrabuddhe

(57) ABSTRACT

One embodiment of the present invention provides a system that detects an occurrence of a given shape which has been fractured into a configuration of primitive shapes which is different from a desired configuration. The system selects a fractured-shape instantiation of the given shape, to which other fractured-shape instantiations for the given shape are compared. As a part of the comparison process, the system generates a filtered mask-pattern-description which includes primitive shapes in the mask-pattern-description that match at least one primitive shape in the selected fractured-shape instantiation. Next, the system identifies a first set of shape occurrences from the filtered mask-pattern-description which match the given shape, and identifies a second set of shape occurrences from the mask-pattern-description which match the given shape. The system then generates a third set of shape occurrences by performing an exclusive-OR comparison between the first and second sets of shape occurrences.

24 Claims, 12 Drawing Sheets

SHAPE OCCURRENCE 100

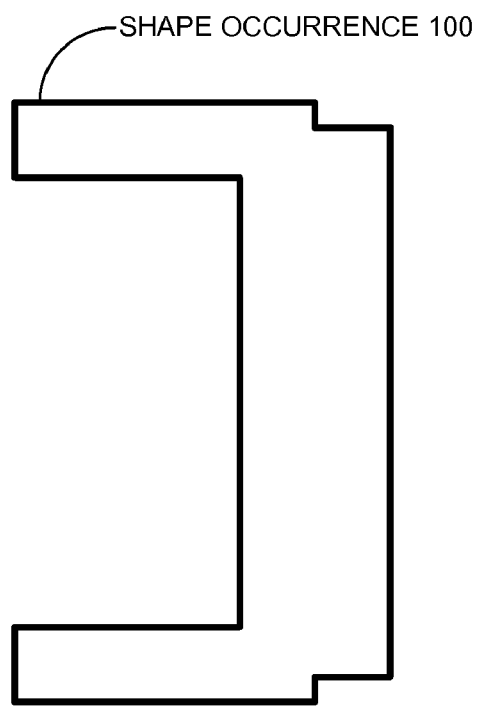
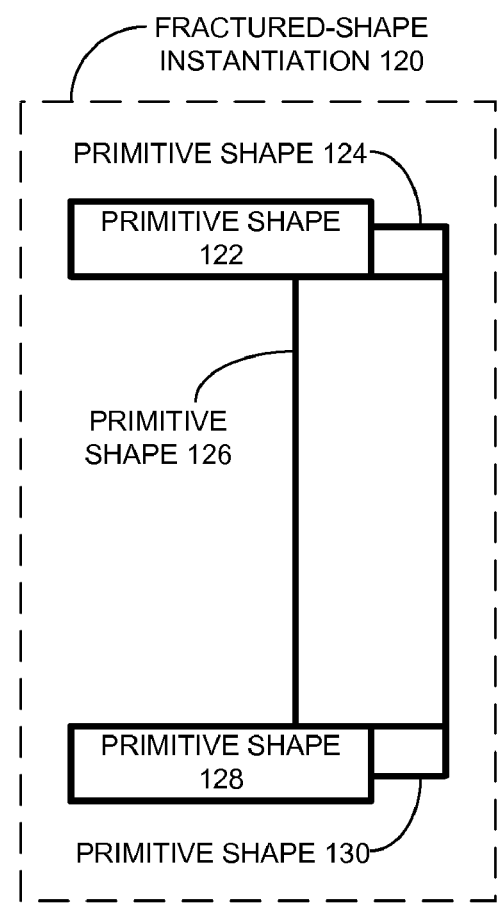
FIG. 1A
FIG. 1B

METHOD AND APPARATUS FOR DETECTING NON-UNIFORM FRACTURING OF A PHOTOMASK SHAPE

RELATED APPLICATION

This application hereby claims priority under 35 U.S.C. §119 to U.S. Provisional Patent Application No. 61/038,695 filed 21 Mar. 2008, entitled "DETECTION OF NON-UNIFORM MASK PATTERN DATA," by inventors John T. Nogatch and Chee Peng Yeap.

BACKGROUND

1. Field of the Invention

The present invention generally relates to electronic design automation. More specifically, the present invention relates to techniques and systems for detecting an occurrence of a shape which has been fractured into a configuration of primitive shapes which is different from a desired configuration.

2. Related Art

Rapid advances in computing technology can largely be attributed to improvements in semiconductor manufacturing technologies, which have made it possible to integrate tens of millions of devices onto a single chip. As part of the semiconductor manufacturing process, a photomask is used to expose a desired pattern on a multitude of semiconductor wafers. Therefore, printing a high-quality photomask is an important step of the semiconductor manufacturing process, because a printing error on the photomask can be propagated onto a multitude of semiconductor wafers.

Critical dimension (CD) variation on a printed photomask is an important measure of photomask quality. CD variation can be quantified as the measured deviation of a pattern on a printed photomask from the original mask pattern description. To produce a high-quality photomask, a mask pattern description typically contains a minimal number of shapes, with a minimal aspect ratio, a minimal number of slivers (i.e., shapes which are small in one or both dimensions), and a minimal number of edge slivers (i.e., slivers which are not sandwiched between other shapes).

Variable shaped beam (VSB) mask-making machines are only capable of writing a limited repertoire of geometric shapes onto a photomask, which typically consists of rectangles and trapezoids. A mask pattern description is processed using Mask data preparation (MDP) fracture software to fracture large and complex shape occurrences into fractured instantiations which contain only primitive shapes that the mask-making machine is capable of reproducing. When a multitude of occurrences of a complex shape exist on a mask pattern description, MDP fracture software may fracture the individual occurrences of the complex shape in different ways. This inconsistent fracturing across occurrences of a complex shape can increase the likelihood of a photomask printing error for the complex shape, and can introduce unnecessary CD variations on a photomask as a result of photomask printing errors.

SUMMARY

One embodiment of the present invention provides a system, comprising methods and apparatuses, that detects an occurrence of a given shape which has been fractured into a configuration of primitive shapes which is different from a desired configuration. To prepare a mask-pattern-description for a VSB mask-making machine, MDP fracture software fractures occurrences of the given shape into fractured-shape instantiations, which includes a set of primitive shapes which are arranged in a particular configuration. A mask-pattern-description can have multiple occurrences of the given shape, and it is possible that MDP fracture software does not fracture these occurrences into a consistent configuration of primitive shapes.

In some embodiments, the system selects a fractured-shape instantiation of the given shape. The selected fractured-shape instantiation can be used as a prototype instantiation of the given shape, to which other fractured-shape instantiations for the given shape are compared. As a part of the comparison process, the system generates a filtered mask-pattern-description based on the selected fractured-shape instantiation. The filtered mask-pattern-description includes primitive shapes in the mask-pattern-description that match at least one primitive shape in the selected fractured-shape instantiation. Next, the system identifies two sets of shape occurrences: a first set of shape occurrences includes shape occurrences from the filtered mask-pattern-description which match the given shape, and a second set of shape occurrences includes shape occurrences from the mask-pattern-description which match the given shape.

In some embodiments, the system generates the filtered mask-pattern-description by first generating a selection rule based on the selected fractured-shape instantiation, wherein the selection rule uses dimensional information to help to identify primitive shapes of the selected fractured-shape instantiation. Then, the system applies the selection rule to the mask-pattern-description to obtain the filtered mask-pattern-description.

In some embodiments, the system identifies the two sets of shape occurrences by first generating a rule for a manufacturing rule check (MRC) tool based on the given shape. The system then applies the rule to the filtered mask-pattern-description to identify the first set of shape occurrences in the filtered mask-pattern-description which match the given shape. Next, the system applies the rule to the mask-pattern-description to identify the second set of shape occurrences in the mask-pattern-description which match the given shape.

In some embodiments, the system performs a comparison operation on the two sets of shape occurrences to generate a third set of shape occurrences, which facilitates identifying occurrences of the first shape which have been fractured differently than the selected fractured-shape instantiation. The third set of shape occurrences includes shape occurrences from the first set of shape occurrences which are not in the second set of shape occurrences, and includes shape occurrences from the second set of shape occurrences which are not in the first set of shape occurrences.

In some embodiments, the system overlays a graphical representation of the third set of shape occurrences with a graphical representation of the mask-pattern-description to indicate shape occurrences in the mask-pattern-description which have been fractured differently than the selected fractured-shape instantiation.

In some embodiments, the system generates an indicator which indicates how uniformly the first shape has been fractured in the mask-pattern-description. The indicator can be the number of shape occurrences in the third set of shape occurrences, or the percentage of shape occurrences in the second set of shape occurrences which have a corresponding shape occurrence in the third set of shape occurrences.

BRIEF DESCRIPTION OF THE FIGURES

FIG. 1A illustrates a shape occurrence in accordance with an embodiment of the present invention.

FIG. 1B illustrates a fractured-shape instantiation in accordance with an embodiment of the present invention.

Figure 2A:
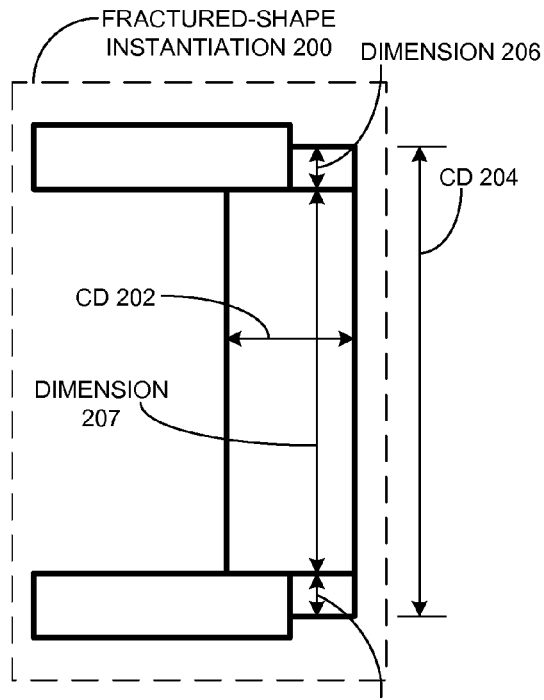
FIGS. 2A-2B illustrate two fractured-shape instantiations in accordance with an embodiment of the present invention.

TABLE 1 presents an exemplary implementation of a script used when converting primitive shape coordinates into SELECT rules in accordance with an embodiment of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Overview

To fabricate an integrated microchip, a mask-pattern-description is produced for the microchip using computer aided design (CAD) software. Before a photomask can be manufactured for the semiconductor device, the mask-pattern-description is produced using mask data preparation (MDP) fracture software to fracture the mask pattern into a collection of primitive shapes. These primitive shapes are basic shapes that a variable shaped beam (VSB) mask-making machine is capable of reproducing, which are typically limited to trapezoids.

FIG. 1A illustrates an exemplary shape occurrence 100 in accordance with an embodiment of the present invention. A shape occurrence can include one or more polygons on a photomask, which are typically fractured into a number of primitive shapes for a VSB mask-making machine. FIG. 1B illustrates an exemplary fractured-shape instantiation 120, which corresponds to shape occurrence 100, in accordance with an embodiment of the present invention. A fractured-shape instantiation is a shape occurrence which is fractured into a set of primitive shapes which are arranged in a particular configuration. Fractured-shape instantiation 120 comprises primitive shapes 122-130, which together form shape occurrence 100.

A VSB mask-making machine produces a higher quality photomask when the fracturing of a number of occurrences for a given shape is uniform across a mask-pattern-description. In other words, every shape occurrence for a shape that repeats across a mask-pattern-description should comprise an identical collection and configuration of primitive shapes. Unfortunately, typical MDP fracture software does not process every shape occurrence in the same way, which can cause two similar shape occurrences to comprise a different collection and configuration of primitive shapes (i.e., the two fractured-shape instantiations are non-uniform).

Figure 2B:
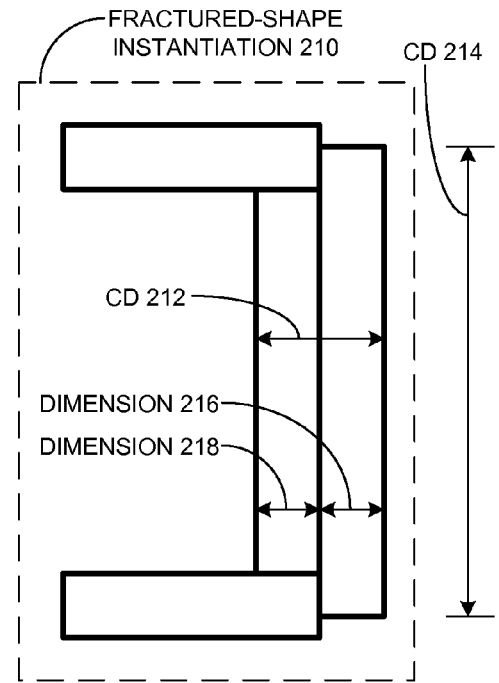

FIGS. 2A-2B illustrate two fractured-shape instantiations in accordance with an embodiment of the present invention. Fractured-shape instantiation 200 and fractured-shape instantiation 210 correspond to a common shape prototype, but include different primitive shape configurations. For example, fractured-shape instantiation 200 implements a critical dimension 202 with one primitive shape, whereas fractured shape instantiation 210 implements a corresponding critical dimension 212 with two primitive shapes. Furthermore, fractured-shape instantiation 200 implements a critical dimension 204 with three primitive shapes, whereas fractured-shape instantiation 210 implements a corresponding critical dimension 214 with one primitive shape.

Figure 2C:
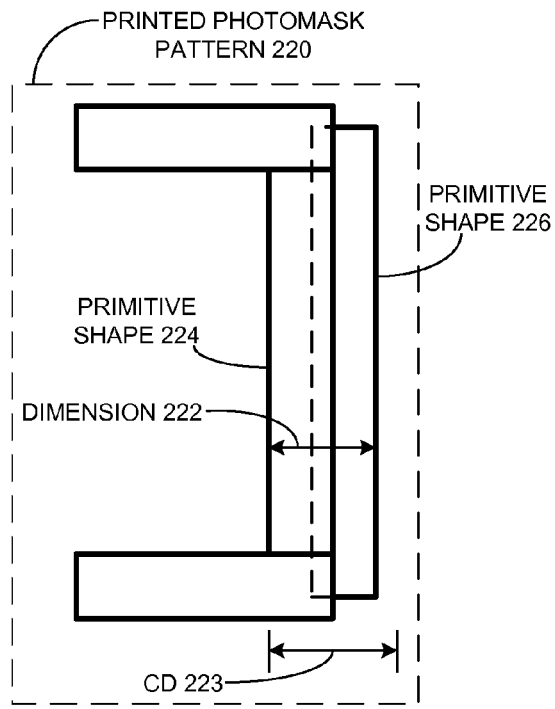
FIGS. 2C-2D illustrate two possible printed photomask patterns for a fractured-shape instantiation in accordance with an embodiment of the present invention.
Figure 2D:
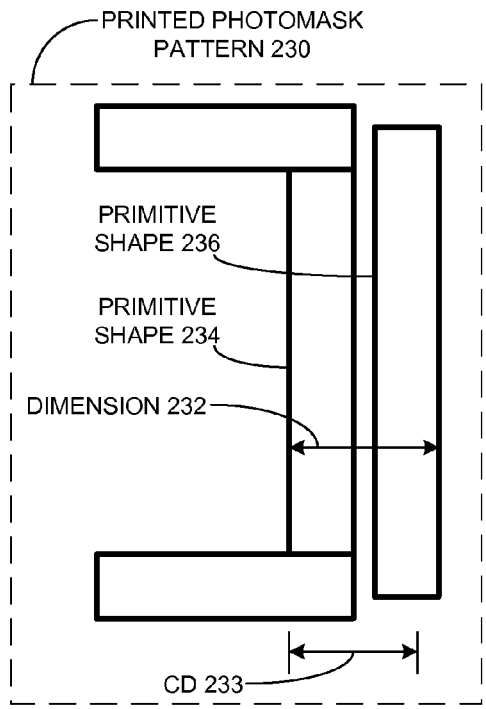

FIGS. 2C-2D illustrate two possible printed photomask patterns 220 and 230 for a fractured-shape instantiation in accordance with an embodiment of the present invention. The variations in printed photomask patterns 220 and 230 illustrate possible effects from a printing error by a VSB mask-making machine. Printed photomask pattern 220 illustrates a primitive shape 226 which is printed with a leftward shift, thereby causing an overlap between primitive shape 224 and primitive shape 226, and producing a dimension 222 which is smaller than a desired critical dimension 223. Conversely, printed photomask pattern 230 illustrates a primitive shape 236 which is printed with a rightward shift, thereby introducing a gap between primitive shape 234 and primitive shape 236, and producing a dimension 232 which is larger than a desired critical dimension 233.

MDP fracture software can decide how to fracture patterns into simple trapezoids, and variations in a critical dimension can be minimized if similar shape occurrences are fractured in the same way. Embodiments of the present invention provide an automated system for detecting non-uniform fractured-shape instantiations for similar shape occurrences in a mask-pattern-description. In some embodiments, this system can be used to perform regression tests on MDP fracture software. In other embodiments, this system can be used to determine the quality of a mask-pattern-description which includes a large number of similar shape occurrences (e.g., memory devices).

Uniformity Checker

Figure 3:
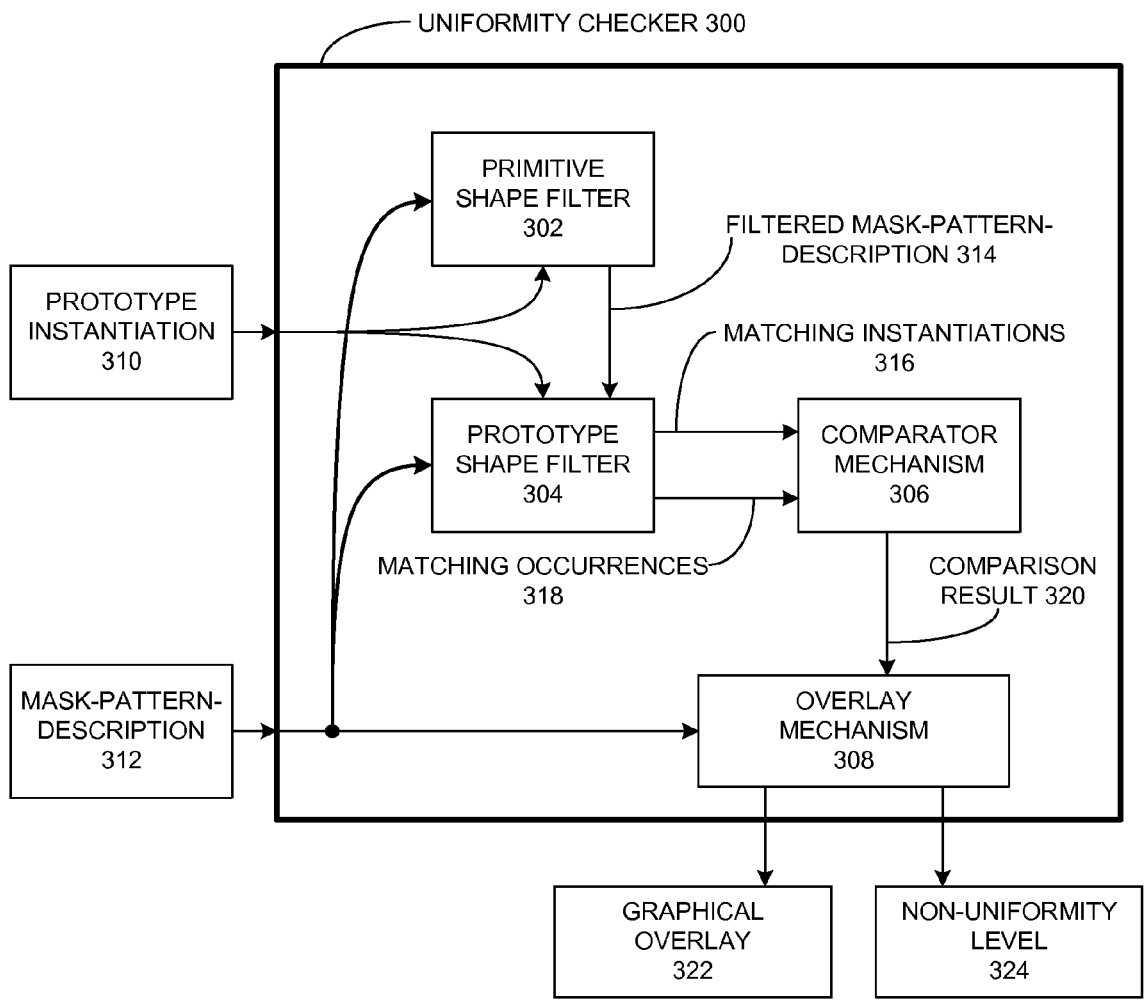
FIG. 3 illustrates a uniformity checker in accordance with an embodiment of the present invention.

FIG. 3 illustrates a block diagram for a uniformity checker 300 in accordance with one embodiment of the present invention. Uniformity checker 300 can detect non-uniform fractured-shape instantiations for similar shape occurrences in a mask-pattern-description. Uniformity checker 300 comprises a primitive shape filter 302, a prototype shape filter 304, a comparator mechanism 306, and an overlay mechanism 308.

During operation, uniformity checker 300 takes a prototype instantiation 310 and a mask-pattern-description 312 as input, and can generate a graphical overlay 322 and a non-uniformity level 324. Prototype instantiation 310 is a fractured-shape instantiation in a mask-pattern-description. As mentioned above, a fractured-shape instantiation represents a fracturing of a shape occurrence, and comprises a set of primitive shapes in a particular configuration. Mask-pattern-description 312 is a collection of fractured-shape instantiations.

In some embodiments, primitive shape filter 302 can generate a filtered mask-pattern-description 314 from prototype instantiation 310 and mask-pattern-description 312. In doing so, primitive shape filter 302 selects primitive shapes in mask-pattern-description 312 which match at least one primitive shape in the set of primitive shapes of prototype instantiation 310, and generates filtered mask-pattern-description 314 which includes the selected primitive shapes.

In some embodiments, prototype shape filter 304 can generate matching instantiations 316 from filtered mask-pattern-description 314 and prototype instantiation 310. In doing so, prototype shape filter 304 identifies a set of shape occurrences from filtered mask-pattern-description 314 which match the shape occurrence associated with prototype instantiation 310, and generates matching instantiations 316 which include the identified set of shape occurrences.

In some embodiments, prototype shape filter 304 can also generate matching occurrences 318 from mask-pattern-description 312 and prototype instantiation 310. In doing so, prototype shape filter 304 identifies a set of shape occurrences from mask-pattern-description 312 which match the shape occurrence associated with prototype instantiation 310, and generates matching occurrences 318 which include the identified set of shape occurrences.

In some embodiments, comparator mechanism 306 can generate comparison result 320, which includes shape occurrences of mask-pattern-description 312 which have been fractured differently than prototype instantiation 310. In doing so, comparator mechanism 306 identifies shape occurrences from matching instantiations 316 which are not in matching occurrences 318, identifies shape occurrences from matching occurrences 318 which are not in matching instantiations 316, and generates comparison result 320 which includes the identified set of shape occurrences.

In some embodiments, overlay mechanism 308 can generate a graphical overlay 322, which can be used to identify shape occurrences in mask-pattern-description 312 which have been fractured differently than prototype instantiation 310. To do so, overlay mechanism 308 overlays a graphical representation of comparison result 320 with a graphical representation of mask-pattern-description 312.

In some embodiments, overlay mechanism 308 can generate a non-uniformity level 324, which indicates how uniformly shape occurrences similar to the prototype instantiation 310 have been fractured in mask-pattern-description 312. In some variations on these embodiments, non-uniformity level 324 is the number of shape occurrences in comparison result 320. In some other variations, non-uniformity level 324 is the percentage of shape occurrences in mask-pattern-description 312 which have a corresponding shape occurrence in comparison result 320.

Figure 4:
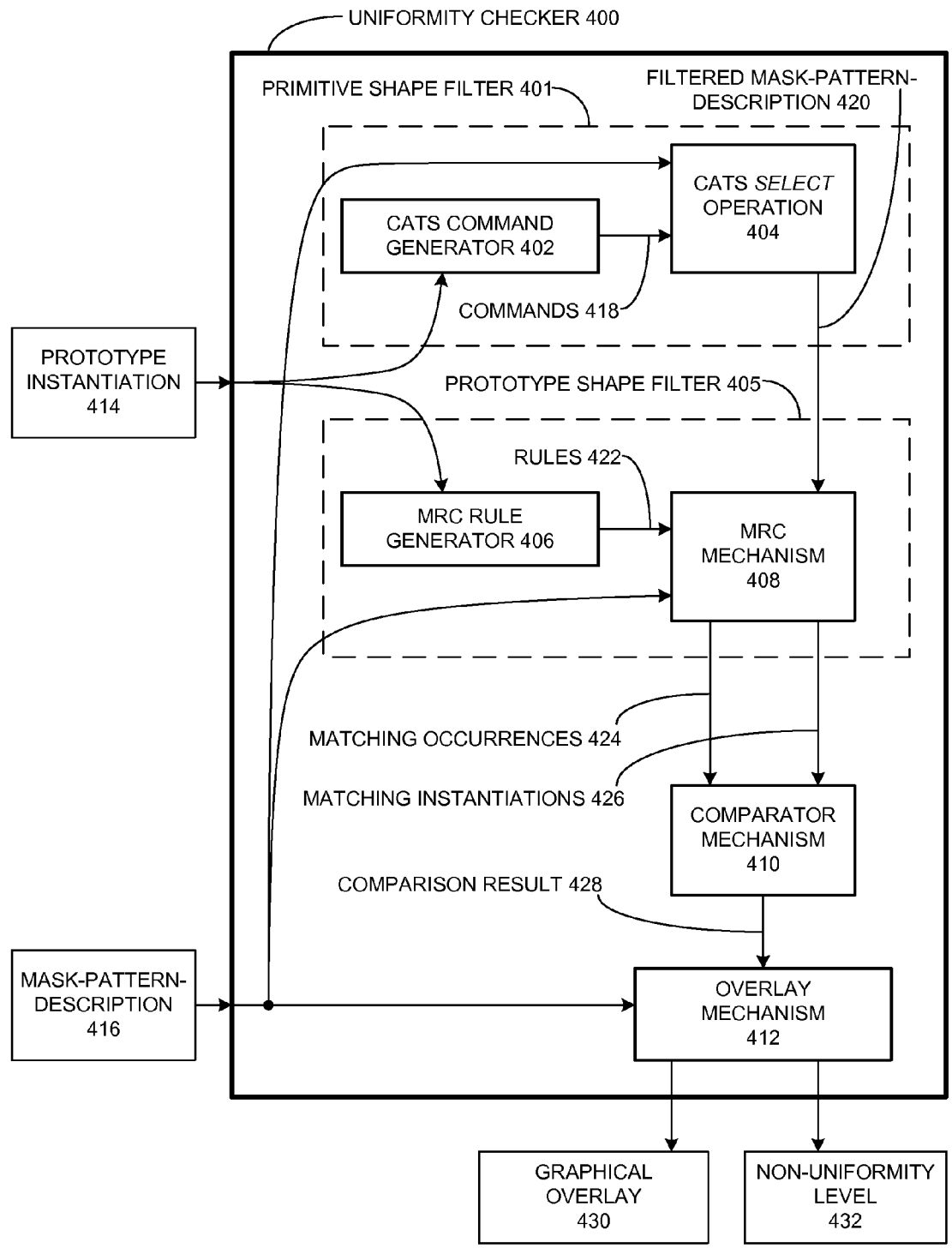
FIG. 4 illustrates an exemplary implementation of a uniformity checker in accordance with an embodiment of the present invention.

FIG. 4 presents an exemplary implementation of a uniformity checker 400 in accordance with one embodiment of the present invention. Uniformity checker 400 uses Synopsys, Inc.'s Computer-Aided Transcription System (CATS) mask data preparation software to identify primitive shapes in a mask-pattern-description. Furthermore, uniformity checker 400 uses an MRC tool to identify shape occurrences in a mask-pattern description. Uniformity checker 400 implements primitive shape filter 401 using a CATS command generator 402 and a CATS SELECT operation 404, implements prototype shape filter 405 using an MRC rule generator 406 and an MRC mechanism 408, and further comprises a comparator mechanism 410 and an overlay mechanism 412.

During operation, uniformity checker 400 takes a prototype instantiation 414 and a mask-pattern-description 416 as input, and can generate a number of graphical overlay 430 and a non-uniformity level 432. Prototype instantiation 414 is a fractured-shape instantiation in a mask-pattern-description, wherein the fractured-shape instantiation represents a fracturing of a shape occurrence, and comprises a set of primitive shapes in a particular configuration. Furthermore, mask-pattern-description 416 is a collection of fractured-shape instantiations.

In some embodiments, CATS command generator 402 uses prototype instantiation 414 to generate commands 418 for CATS SELECT operation 404. CATS SELECT operation 404 uses commands 418 to generate a filtered mask-pattern-description 420 from mask-pattern-description 416. In doing so, CATS SELECT operation 404 selects primitive shapes in mask-pattern-description 416 that match at least one primitive shape in the set of primitive shapes of prototype instantiation 414, and generates filtered mask-pattern-description 420 which includes the selected primitive shapes.

In some embodiments, MRC rule generator 406 uses prototype instantiation 414 to generate rules 422 for MRC mechanism 408. MRC mechanism 408 uses rules 422 to generate matching occurrences 424 from mask-pattern-description 416. In doing so, MRC mechanism 408 identifies a set of shape occurrences from mask-pattern-description 416 which match the shape occurrence associated with prototype instantiation 414, and generates matching occurrences 424 which include the identified set of shape occurrences.

In some embodiments, MRC mechanism 408 can also use rules 422 to generate matching instantiations 426 from filtered mask-pattern-description 420. In doing so, MRC mechanism 408 identifies a set of shape occurrences from filtered mask-pattern-description 420 which match the shape occurrence associated with prototype instantiation 414, and generates matching instantiations 426 which include the identified set of shape occurrences.

In some embodiments, comparator mechanism 410 can generate comparison result 428, which includes shape occurrences of mask-pattern-description 416 which have been fractured differently than prototype instantiation 414. In doing so, comparator mechanism 410 identifies shape occurrences from matching instantiations 426 which are not in matching occurrences 424, identifies shape occurrences from matching occurrences 424 which are not in matching instantiations 426, and generates comparison result 428 which includes the identified set of shape occurrences.

In some embodiments, overlay mechanism 412 can generate a graphical overlay 430, which can be used to identify shape occurrences in mask-pattern-description 416 which have been fractured differently than prototype instantiation 414. To do so, overlay mechanism 412 overlays a graphical representation of comparison result 428 on a graphical representation of mask-pattern-description 416.

In some embodiments, overlay mechanism 412 can generate a non-uniformity level 432, which indicates how uniformly shape occurrences similar to prototype instantiation 414 have been fractured in mask-pattern-description 416. In some variations on these embodiments, non-uniformity level 432 is the number of shape occurrences in comparison result 428. In some other variations, non-uniformity level 432 is the percentage of shape occurrences in mask-pattern-description 416 which have a corresponding shape occurrence in comparison result 428.

Coordinate Extraction and Selection Rules Filtering

Figure 5:
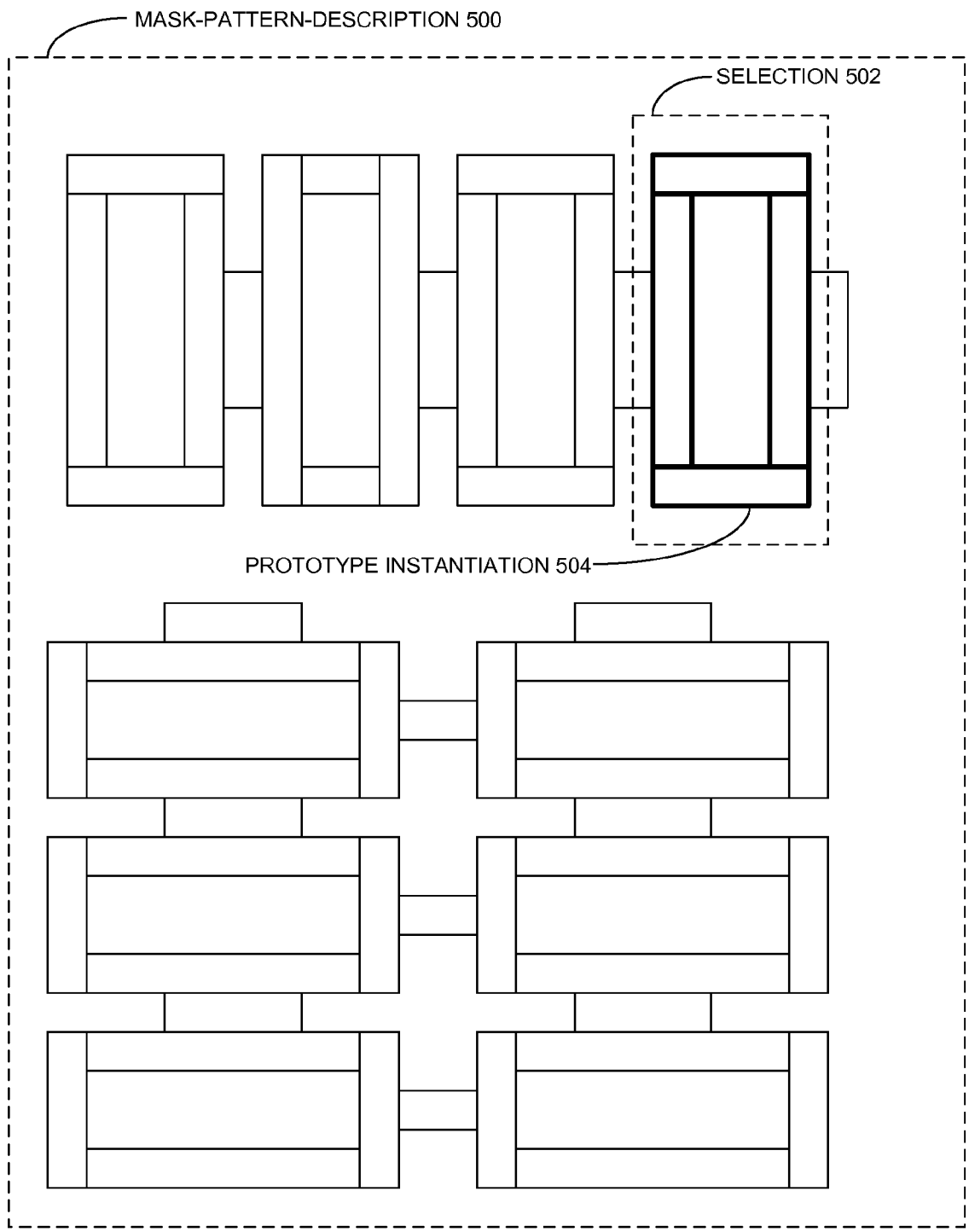
FIG. 5 illustrates a graphical representation of a mask-pattern-description in accordance with an embodiment of the present invention.

FIG. 5 presents an exemplary graphical representation of a mask-pattern-description 500 in accordance with one embodiment of the present invention. Mask-pattern-description 500 includes a number of occurrences of a shape, which repeats across mask-pattern-description 500, and at various orientations. A uniformity checker compares the fracturing of these shape occurrences to a prototype instantiation 504, and identifies any shape occurrence which has been fractured differently than prototype instantiation 504. In some embodiments, the uniformity checker can determine a selection 502 for a prototype instantiation 504 automatically. In other embodiments, a user can specify a selection 502 for a prototype instantiation 504 manually. In one embodiment, a selection 502 can include one or more primitive shapes from mask-pattern-description 500, and the selected primitive shapes are used to define prototype instantiation 504.

In some embodiments, coordinate information for the primitive shapes in prototype instantiation 504 can be extracted to create selection rules and commands. In one embodiment, a textual description can be generated for the coordinate information of the selected shapes. An exemplary illustration of a textual description for the coordinates of a selected prototype instantiation is as follows:

| xb: 57.32 | yb: 41.74 | xt: 58.12 | yt: 41.94 |
| xb: 57.32 | yb: 41.94 | xt: 57.52 | yt: 42.74 |
| xb: 57.32 | yb: 42.74 | xt: 58.12 | yt: 42.94 |
| xb: 57.92 | yb: 41.94 | xt: 58.12 | yt: 42.74 |

In this example, the textual descriptions represent the lower left and upper right coordinates of each primitive shape of prototype instantiation 504, where xb,yb represents a lower-left coordinate and xt,yt represents an upper-right coordinate.

In one embodiment, the coordinate information for a primitive shape of prototype instantiation 504 can be extracted and converted into a selection rule using fracture software (e.g., CATS). The operations for selecting prototype instantiation 504 and extracting the coordinates for the primitive shapes of prototype instantiation 504 can be performed using CATS as follows:

(1) A "SELECT PRIMARY 1 WITHIN" command can be issued when a user drags a selection box over prototype instantiation 504.

(2) An "OUTPUT prototype_01.cflt" command can then be issued to indicate a temporary output file name.

(3) A "DO" command can then be issued to perform a fracture on prototype instantiation 504 in order to isolate the figures of the selected prototype instantiation 504.

(4) A "SWITCH" command can then be issued to change the fracture context.

(5) A "COPY OUTPUT" command can then be issued to input the temporary file that was just created.

(6) A "RECORDFILE proto.txt" command can then be issued to capture the output of the next command.

(7) A "FIGURES" command can then be issued to display the figures of the prototype instantiation as text. More particularly, the "FIGURES" command displays a textual description for the vertices of the rectangles of the selected instantiation. This textual description can then be used as input to an "awk" script (see TABLE 1) that can be used to convert the coordinates into selection rules ("SELECT" commands).

(8) A "RECORDFILE VOID" may then be used to terminate output capture.

TABLE 1 presents an exemplary implementation of a script used when converting primitive shape coordinates into SELECT rules in accordance with an embodiment of the present invention. The script can parse the lower-left and upper-right coordinate sets (i.e., xb,yb and xt,yt, respectively) of a primitive shape, and compute the height and width of the primitive shape. In this exemplary script, "maxhw" refers to a maximum height or width of a primitive shape, and "minhw" refers to a minimum height or width of the primitive shape.

TABLE 1

```
set line0 = `wc -l test.ctxt | awk '{print $1}'`
@ line = $line0 -1
while ( $CONT == 0 )
set line$count = `awk 'NR == '$countu test.ctxt`
set xb = `awk 'NR == '$count'" test.ctxt | awk '{print $1}' | sed -n 's/xb://p'`
set yb = `awk 'NR == '$count'" test.ctxt | awk '{print $2}' | sed -n 's/yb://p'`
```

TABLE 1-continued

```
set xt = `awk 'NR == '$count" test.ctxt | awk '(print $3}' | sed -n
's/xt://p'`
set yt = `awk 'NR == '$count" test.ctxt | awk '(print $4}' | sed -n
's/yt://p'`

#find x and y dimensions

set xdiff = `awk 'BEGIN {print ARGV[1] – ARGV[2]}' $xt $xb`
set ydiff = `awk 'BEGIN {print ARGV[1] – ARGV[2]}' $yt $yb`
if ( awk 'BEGIN {print ARGV[1] <= ARGV[2]}' $xdiff $ydiff ) then
        set minhw = $xdiff
        set maxhw = $ydiff
        else
        set minhw = $ydiff
        set maxhw = $xdiff
endif
```

Figure 6:
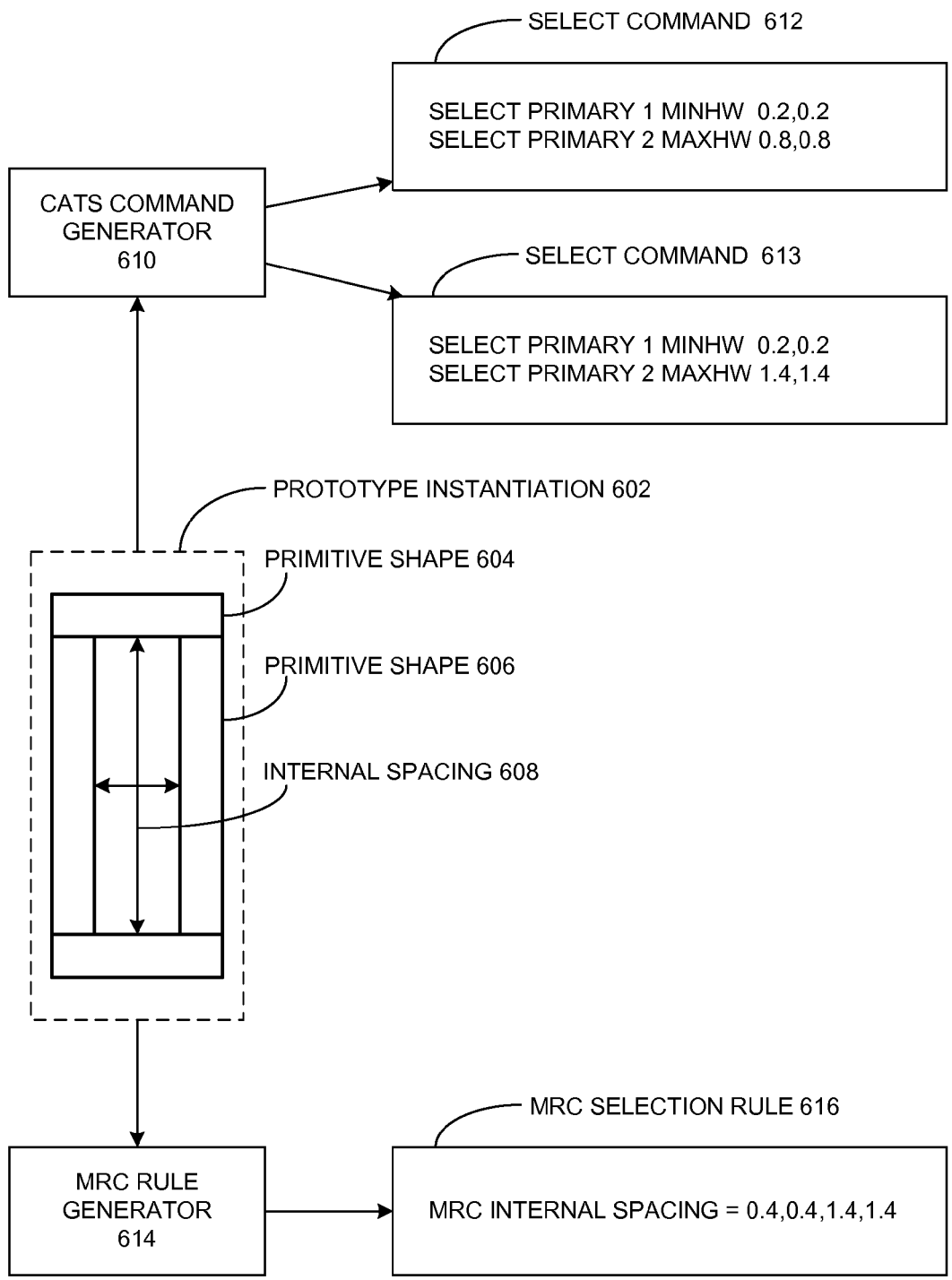
FIG. 6 presents a flow chart illustrating a process for generating a SELECT command, and a process for generating a rule for a manufacturing rule check (MRC) tool in accordance with an embodiment of the present invention.

FIG. 6 presents a flow chart illustrating a process for generating commands for the CATS SELECT operation, and a process for generating a rule for an MRC tool in accordance with an embodiment of the present invention. CATS command generator 610 uses primitive shapes 604-606 of prototype instantiation 602 to generate SELECT commands 612-613, which are used by the uniformity checker to identify primitive shapes in a mask-pattern-description that match primitive shapes 604-606. In some embodiments, CATS command generator 610 generates SELECT command 612 based on minimum and maximum dimensions of a primitive shape (e.g., the "minhw" and "maxhw" dimensional values presented in TABLE 1). For example, a SELECT command 612 for selecting primitive shape 604 can be implemented as follows:

SELECT PRIMARY 1 MINHW 0.2,0.2 SELECT PRIMARY 2 MAXHW 0.8,0.8

MRC Rules

In some embodiments, MRC rule generator 614 uses dimensional information from a shape occurrence to generate MRC selection rule 616, which is used by an MRC tool to identify shape occurrences in a mask-pattern-description which match the shape occurrence associated with prototype instantiation 602. In some embodiments, MRC rule generator 614 generates MRC selection rule 616 based on an internal spacing of prototype instantiation 602. For example, MRC selection rule 616 is associated with internal spacing 608 of prototype instantiation 602, which has a minimum dimension of 0.4 units, and has a maximum dimension of 1.4 units. In other embodiments, MRC rule generator 614 generates MRC selection rule 616 based on a contour shape of prototype instantiation 602.

Figure 7:
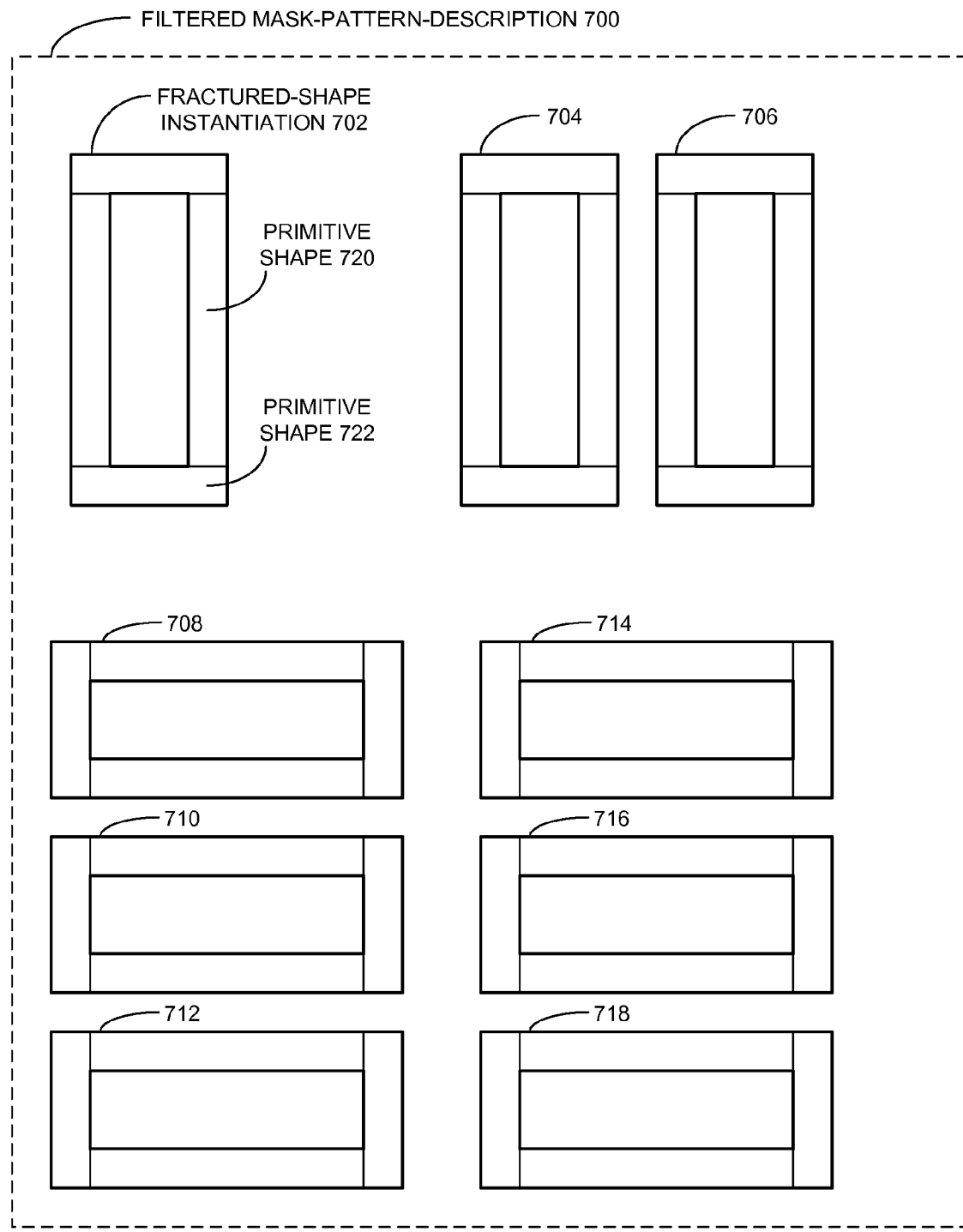
FIG. 7 illustrates a filtered mask-pattern-description in accordance with an embodiment of the present invention.

FIG. 7 illustrates a graphical representation of a filtered mask-pattern-description 700 in accordance with an embodiment of the present invention. Filtered mask-pattern-description 700 corresponds to the filtered output produced by applying the CATS SELECT command to the original mask-pattern-description. Filtered mask-pattern-description 700 includes fractured-shape instantiations 702-718, which comprise primitive shapes which match the primitive shapes of a prototype instantiation.

In one embodiment, the SELECT commands can filter a mask-pattern-description by considering individually each primitive shape of a prototype instantiation. For example, a first SELECT command can identify shape occurrences which have matching dimensions to primitive shape 720, and can produce a first temporary file which includes the identified shape occurrences. Similarly, a second SELECT command can identify shape occurrences which have matching dimensions to primitive shape 722, and can produce a second temporary file which includes the identified shape occurrences. Further commands can be performed for other primitive shapes of a prototype instantiation, and the multiple temporary files which include the identified primitive shapes can be merged using inclusive-OR fracture steps to produce filtered mask-pattern-description 700.

In some variations on this embodiment, the CATS Conditional Figure Assignment (CFA) command can be used to allow shapes to be tagged with numeric values based on commands similar to the SELECT commands, and the resulting file can be filtered based on the tag information. Using the CFA command to tag a primitive shape with its dimensional information can generate filtered mask-pattern-description 700 in two fracture steps, regardless of the number of primitive shapes in the prototype instantiation.

Figure 8A:
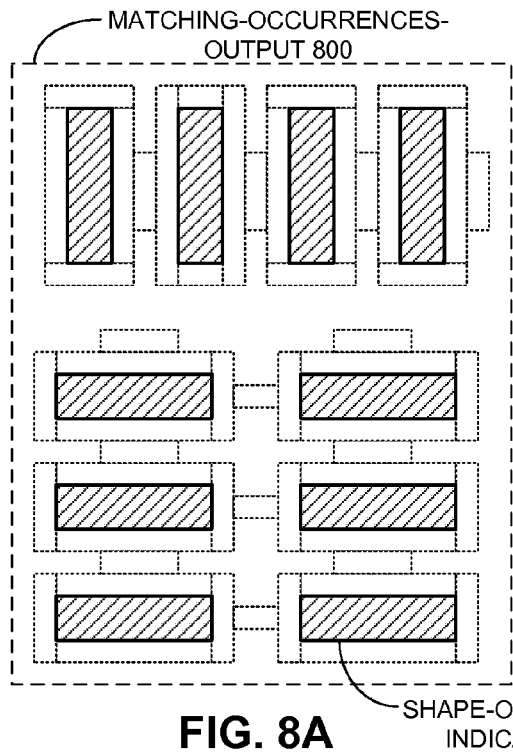
FIG. 8A illustrates a graphical representation of a mask-occurrence-output in accordance with an embodiment of the present invention.

FIG. 8A illustrates a graphical representation of a matching-occurrences-output 800 in accordance with an embodiment of the present invention. Matching-occurrences-output 800 is generated by applying the MRC selection rules to a mask-pattern-description. For illustration purposes, the mask-pattern-description is presented in FIG. 8A as dotted lines. Matching-occurrences-output 800 includes a number of indicators (e.g., shape occurrence indicator 802), which identify shape occurrences which match a prototype shape occurrence of the mask-pattern-description, regardless of whether the identified shape occurrences have been fractured in the same way the prototype shape occurrence has been fractured.

Figure 8B:
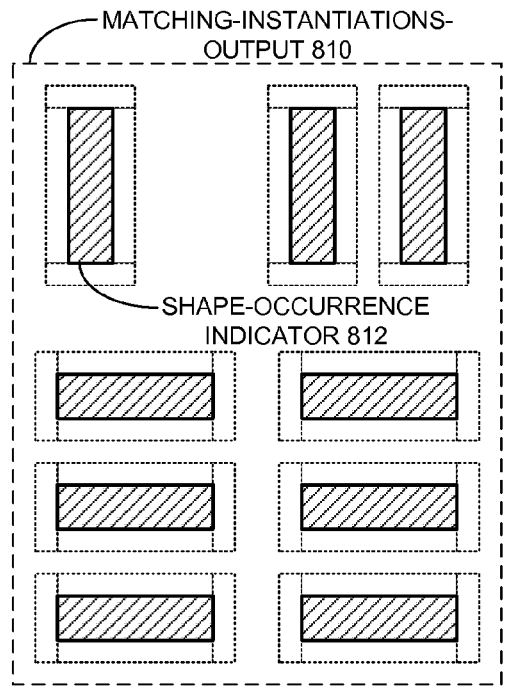
FIG. 8B illustrates a graphical representation of a matching-instantiations-output in accordance with an embodiment of the present invention.

FIG. 8B illustrates a graphical representation of a matching-instantiations-output 810 in accordance with an embodiment of the present invention. Matching-instantiations-output 810 is generated by applying the MRC selection rules to a filtered mask-pattern-description. For illustration purposes, the filtered mask-pattern-description is presented in FIG. 8B as dotted lines. Matching-instantiations-output 810 includes a number of indicators (e.g., shape occurrence indicator 812), which identify shape occurrences which match a prototype shape occurrence of the mask-pattern-description, and have been fractured in the same way the prototype shape occurrence has been fractured.

Figure 8C:
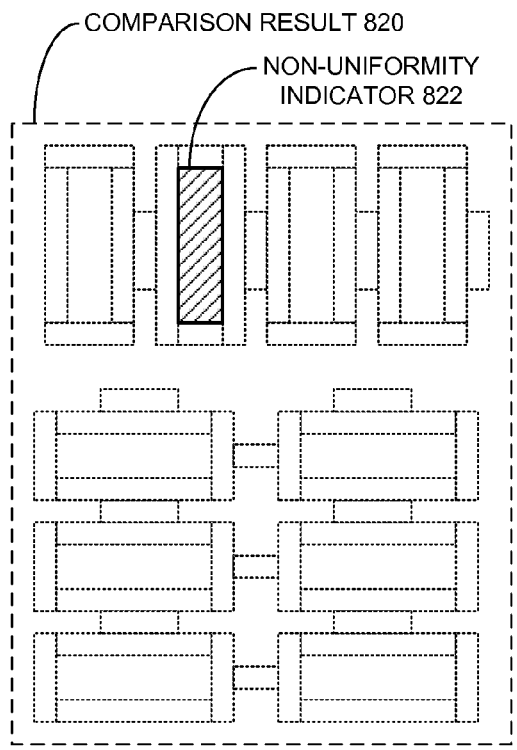
FIG. 8C illustrates a graphical representation of a comparison result in accordance with an embodiment of the present invention.

FIG. 8C illustrates a graphical representation of a comparison result 820 from a comparison between matching-occurrences-output 800 and matching-instantiations-output 810 in accordance with an embodiment of the present invention. Applying the MRC rules to both the filtered and unfiltered mask-pattern-descriptions produces two sets of shape occurrence indicators, where the exclusive-OR comparison between the two sets contains indicators to shape occurrences which are similar to a prototype shape occurrence, but have been fractured differently than the fracturing of the prototype shape occurrence.

In some embodiments, comparison result 820 comprises the exclusive-OR comparison between the matching-occurrences-output and the matching-instantiations-output, which can be generated by selecting shape occurrences from matching-instantiations-output 810 which are not in matching-occurrences-output 800, and selecting shape occurrences from matching-occurrences-output 800 which are not in matching-instantiations-output 810. Comparison result 820 includes a non-uniformity indicator 822, which indicates a shape occurrence that has been fractured differently than a prototype shape occurrence. For illustration purposes, the mask-pattern-description is presented in FIG. 8C as dotted lines.

Figure 8D:
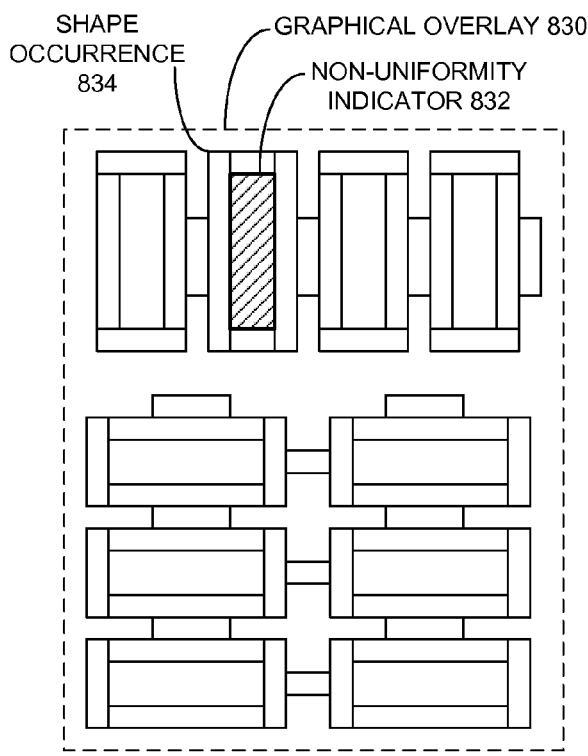
FIG. 8D illustrates a graphical overlay of a non-uniform shape occurrence on a mask-pattern-description in accordance with an embodiment of the present invention.

FIG. 8D illustrates a graphical overlay 830 of a non-uniformity indicator 832 on a mask-pattern-description in accordance with an embodiment of the present invention. Graphical overlay 830 includes a graphical representation of a maskpattern-description, and a graphical representation of a comparison result which comprises a number of non-uniformity indicators (e.g., non-uniformity indicator 832). By overlaying a graphical representation of the comparison result with a graphical representation of the mask-pattern-description, graphical overlay 830 facilitates identifying shape occurrence 834 in the mask-pattern-description, which has been fractured differently than the fracturing of the prototype shape occurrence.

Figure 9:
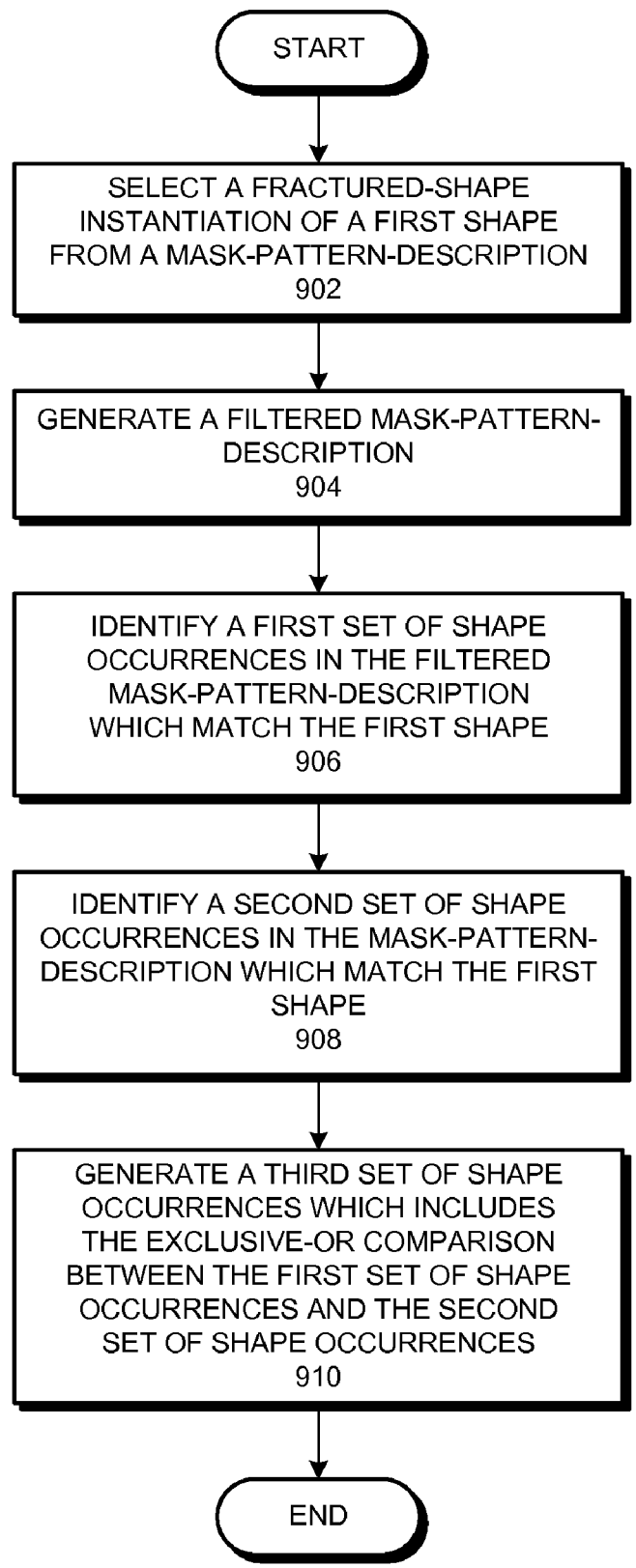
FIG. 9 presents a flow chart that illustrates a process for detecting an occurrence of a shape which has been fractured into a configuration of primitive shapes which is different from a desired configuration in accordance with an embodiment of the present invention.

FIG. 9 presents a flow chart that illustrates a process for detecting an occurrence of a shape which has been fractured into a configuration of primitive shapes which is different from a desired configuration in accordance with an embodiment of the present invention. The system begins by selecting a fractured-shape instantiation of a first shape from a mask-pattern-description (operation 902). The fractured-shape instantiation represents a fracturing of the first shape, and comprises a set of primitive shapes which are arranged in a particular configuration. The mask-pattern-description can comprise multiple occurrences of the first shape. Then, the system generates a filtered mask-pattern-description from the mask-pattern description based on the selected fractured-shape instantiation (operation 904). The filtered mask-pattern-description includes primitive shapes in the mask-pattern-description that match at least one primitive shape in the set of primitive shapes of the fractured-shape instantiation.

Next, the system identifies a first set of shape occurrences in the filtered mask-pattern-description which match the first shape (operation 906), and identifies a second set of shape occurrences in the mask-pattern-description which match the first shape (operation 908). The system then generates a third set of shape occurrences which includes the exclusive-OR comparison between the first set of shape occurrences and the second set of occurrences (operation 910). In other words, the system generates the third set of shape occurrences to include shape occurrences from the first set of shape occurrences which are not in the second set of shape occurrences, and to include shape occurrences from the second set of shape occurrences which are not in the first set of shape occurrences.

Figure 10:
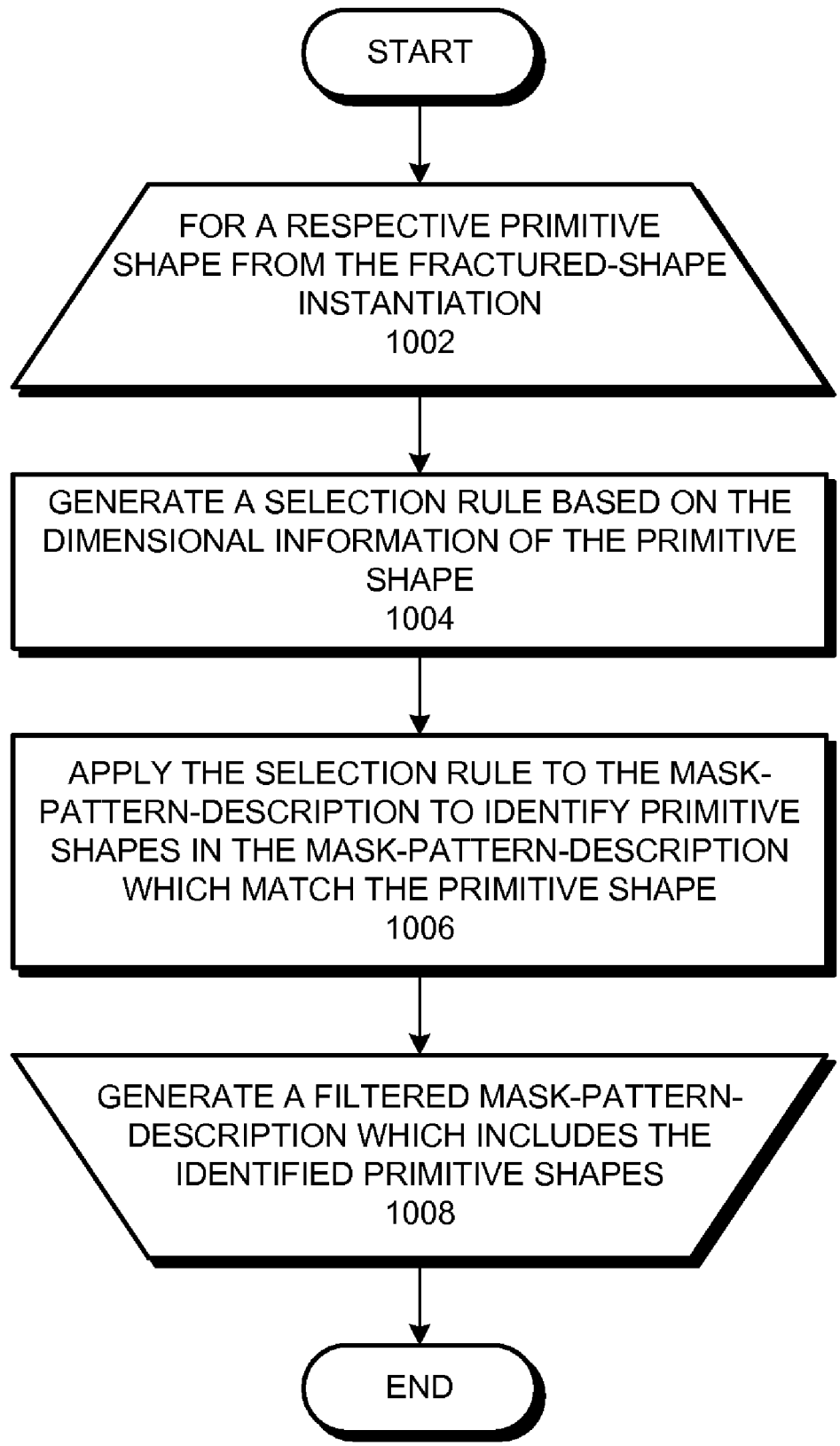
FIG. 10 presents a flow chart that illustrates a process for generating a filtered mask-pattern-description in accordance with an embodiment of the present invention.

FIG. 10 presents a flow chart that illustrates a process for generating a filtered mask-pattern-description, which expands upon operation 904 of FIG. 9, in accordance with an embodiment of the present invention. The system begins by, for a respective primitive shape from the fractured-shape-instantiation (operation 1002), generating a selection rule based on the dimensional information of the primitive shape (operation 1004). Then, the system applies the selection rule to the mask-pattern-description to identify primitive shapes in the mask-pattern-description which match the primitive shape (operation 1006). The system then generates a filtered mask-pattern-description which includes the identified primitive shapes (operation 1008).

Figure 11:
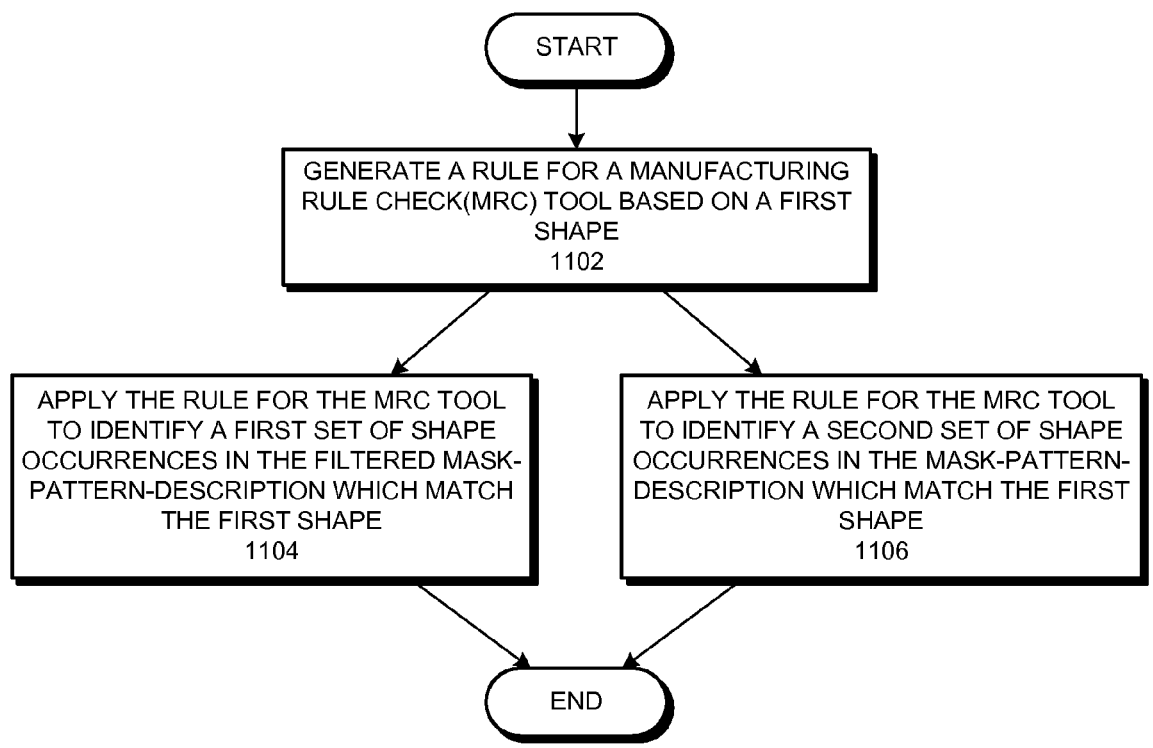
FIG. 11 presents a flow chart that illustrates a process for identifying shape occurrences in a mask-pattern-description and in a filtered mask-pattern-description which match a first shape in accordance with an embodiment of the present invention.

FIG. 11 presents a flow chart that illustrates a process for identifying shape occurrences in a mask-pattern-description and in a filtered mask-pattern-description which match a first shape in accordance with an embodiment of the present invention. The system begins by generating a rule for an MRC tool based on the first shape (operation 1102). Then, the system applies the rule for the MRC tool to identify a first set of shape occurrences in the filtered mask-pattern-description which match the first shape (operation 1104). The system also applies the rule for the MRC tool to identify a second set of shape occurrences in the mask-pattern-description which match the first shape (1106).

Computer System

Figure 12:
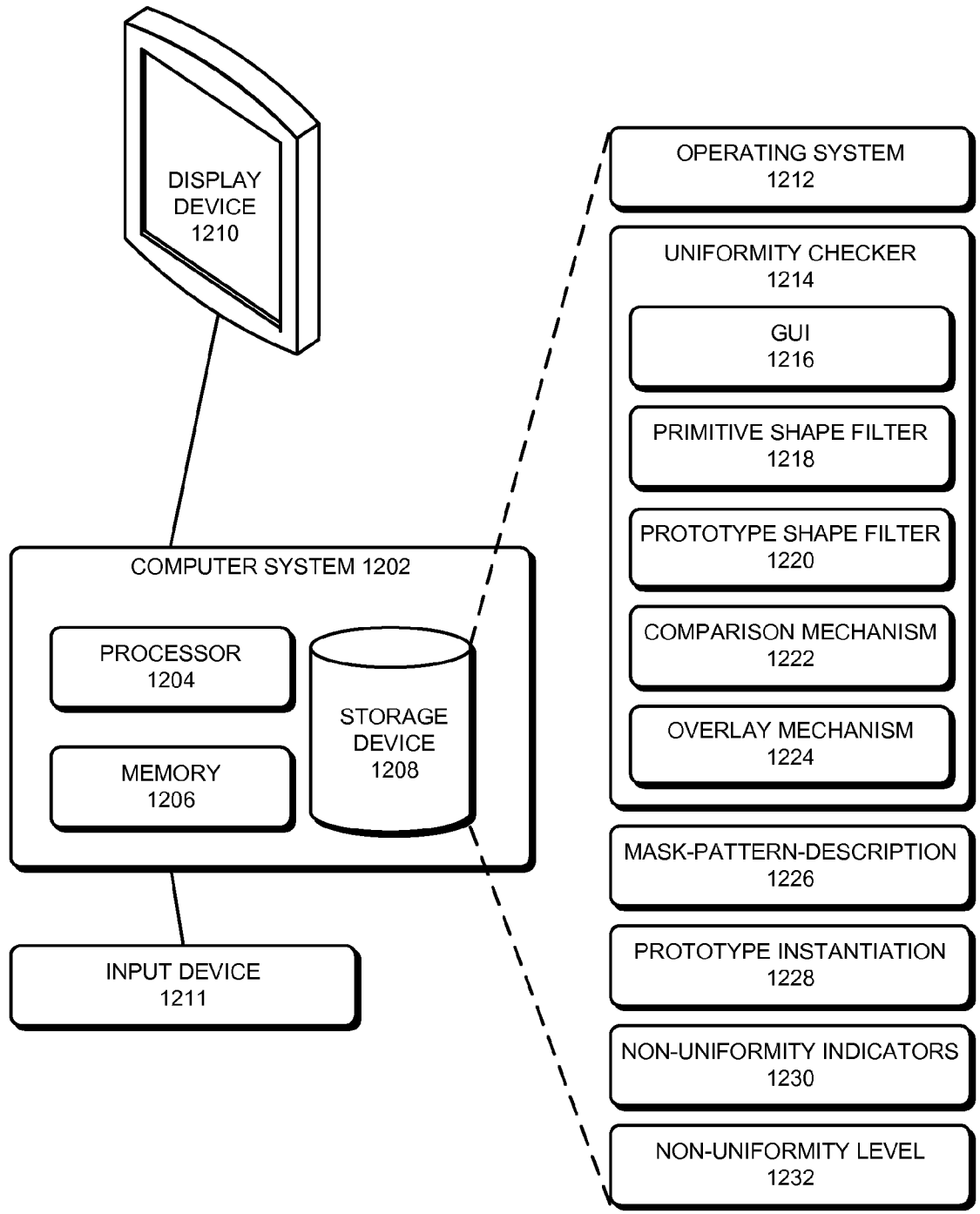
FIG. 12 illustrates an exemplary computer system that facilitates detecting an occurrence of a shape which has been fractured into a configuration of primitive shapes which is different from a desired configuration in accordance with an embodiment of the present invention.

FIG. 12 illustrates an exemplary computer system that facilitates detecting an occurrence of a shape which has been fractured into a configuration of primitive shapes which is different from a desired configuration in accordance with an embodiment of the present invention. Computer system 1202 includes a processor 1204, a memory 1206, and a storage device 1208. Furthermore, computer system 1202 can be coupled to a display device 1210 and an input device 1211.

Storage device 1208 stores an operating system 1212, a uniformity checker 1214, a mask-pattern-description 1226, a prototype instantiation 1228, a number of non-uniformity indicators 1230, and a non-uniformity level 1232. Uniformity checker 1214 includes a graphical user interface (GUI) 1216, a primitive shape filter 1218, a prototype shape filter 1220, a comparison mechanism 1222, and an overlay mechanism 1224.

During operation, uniformity checker 1214 is loaded from storage device 1208 into memory 1206 and is executed by processor 1204. Uniformity checker 1214 takes a mask-pattern-description 1226 and a prototype instantiation 1228 as input, and generates non-uniformity indicators 1230 and non-uniformity level 1232. In some embodiments, uniformity checker 1214 allows a user to identify a prototype instantiation 1228 by using input device 1211 to select a fractured-shape occurrence of mask-pattern-description 1226. In some embodiments, GUI module 1216 presents a graphical overlay of non-uniformity indicators 1230 on a graphical representation of mask-pattern-description 1226 to enable a user to identify non-uniform fractured-shape instantiations in mask-pattern-description 1226 without having to analyze the details of fractured-shape instantiations.

Variations on Embodiments of the Present Invention

In some embodiments, a uniformity checker can be used to perform regression tests on MDP fracture software. The uniformity checker can be applied onto a mask-pattern-description generated by MDP fracture software to determine how uniform the fracturing of a given shape is across a number of occurrences for the given shape. During regression testing, the output of the MDP fracture software can be compared to an expected output. In some variations on these embodiments, the position and quantity of the non-uniform fractured-shape instantiations can be compared to an expected result. In other variations, the uniformity level generated by MDP fracture software can be compared to an expected uniformity level. The outcome of these comparisons can indicate whether the MDP fracture software is producing a fractured mask-pattern-description which is consistent with results produced by prior versions of the software.

In some embodiments, the uniformity checker can produce a graphical overlay of non-uniformity indicators on a mask-pattern-description to allow a user to perform a manual review of the fracturing for the mask-pattern-description. The non-uniformity indicators of the graphical overlay allow a user to pan through a mask-pattern-description in search of non-uniform fractured-shape instantiations without having to analyze the details of fractured-shape instantiations, and allow a user to zoom into portions of a mask-pattern-description which are indicated to include a number of non-uniform fractured-shape instantiations.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for detecting an occurrence of a shape which has been fractured into a configuration of primitive shapes which is different from a desired configuration, comprising:
    selecting a fractured-shape instantiation in a first mask-pattern-description, wherein the fractured-shape instantiation represents a fracturing of a first shape, wherein the fractured-shape instantiation comprises a set of primitive shapes which are arranged in a particular configuration, and wherein the first mask-pattern-description comprises multiple occurrences of the first shape;
    generating, by computer, a filtered mask-pattern-description which includes identified primitive shapes in the first mask-pattern-description, wherein each primitive shape in the identified primitive shapes matches at least one primitive shape in the set of primitive shapes;
    identifying a first set of shape occurrences from the filtered mask-pattern-descriptions, wherein each shape occurrence in the first set of shape occurrences matches the first shape;
    identifying a second set of shape occurrences from the first mask-pattern-description, wherein each shape occurrence in the second set of shape occurrences matches the first shape; and
    generating a third set of shape occurrences which includes:
        shape occurrences from the first set of shape occurrences which are not in the second set of shape occurrences, and
        shape occurrences from the second set of shape occurrences which are not in the first set of shape occurrences;
    wherein the third set of shape occurrences facilitates identifying occurrences of the first shape which have been fractured differently than the fractured-shape instantiation.

2. The method of claim 1, wherein generating the filtered mask-pattern-description comprises:
    generating a selection rule based on the fractured-shape instantiation, wherein the selection rule uses dimensional information to help identify primitive shapes in the set of primitive shapes; and
    applying the selection rule to the first mask-pattern-description to obtain the filtered mask-pattern-description.

3. The method of claim 1, wherein identifying the first set of shape occurrences from the filtered mask-pattern-description comprises generating a rule for a manufacturing rule check (MRC) tool based on the first shape.

4. The method of claim 3, wherein identifying the first set of shape occurrences from the filtered mask-pattern-description further comprises applying the rule for the MRC tool to identify the first set of shape occurrences from the filtered mask-pattern-description which match the first shape.

5. The method of claim 3, wherein identifying the second set of shape occurrences from the first mask-pattern-description comprises applying the rule for the MRC tool to identify the second set of shape occurrences from the first mask-pattern-description which match the first shape.

6. The method of claim 1, further comprising overlaying a graphical representation of the third set of shape occurrences with a graphical representation of the first mask-pattern-description to indicate shape occurrences in the first mask-pattern-description which have been fractured differently than the fractured-shape instantiation.

7. The method of claim 1, further comprising generating an indicator which indicates how uniformly the first shape has been fractured in the first mask-pattern-description.

8. The method of claim 7, wherein the indicator is one of:
    the number of shape occurrences in the third set of shape occurrences, and the percentage of shape occurrences in the second set of shape occurrences which have a corresponding shape occurrence in the third set of shape occurrences.

9. A non-transitory computer-readable storage medium storing instructions that when executed by a computer cause the computer to perform a method for detecting an occurrence of a shape which has been fractured into a configuration of primitive shapes which is different from a desired configuration, the method comprising:
    selecting a fractured-shape instantiation in a first mask-pattern-description, wherein the fractured-shape instantiation represents a fracturing of a first shape, wherein the fractured-shape instantiation comprises a set of primitive shapes which are arranged in a particular configuration, and wherein the first mask-pattern-description comprises multiple occurrences of the first shape;
    generating a filtered mask-pattern-description which includes identified primitive shapes in the first mask-pattern-description, wherein each primitive shape in the identified primitive shapes matches at least one primitive shape in the set of primitive shapes;
    identifying a first set of shape occurrences from the filtered mask-pattern-description, wherein each shape occurrence in the first set of shape occurrences matches the first shape;
    identifying a second set of shape occurrences from the first mask-pattern-description, wherein each shape occurrence in the second set of shape occurrences matches the first shape; and
    generating a third set of shape occurrences which includes:
        shape occurrences from the first set of shape occurrences which are not in the second set of shape occurrences, and
        shape occurrences from the second set of shape occurrences which are not in the first set of shape occurrences;
    wherein the third set of shape occurrences facilitates identifying occurrences of the first shape which have been fractured differently than the fractured-shape instantiation.

10. The non-transitory computer-readable storage medium of claim 9, wherein generating the filtered mask-pattern-description comprises:
    generating a selection rule based on the fractured-shape instantiation, wherein the selection rule uses dimensional information to help identify primitive shapes in the set of primitive shapes; and
    applying the selection rule to the first mask-pattern-description to obtain the filtered mask-pattern-description.

11. The non-transitory computer-readable storage medium of claim 9, wherein identifying the first set of shape occurrences from the filtered mask-pattern-description comprises generating a rule for a manufacturing rule check (MRC) tool based on the first shape.

12. The non-transitory computer-readable storage medium of claim 11, wherein identifying the first set of shape occurrences from the filtered mask-pattern-description further comprises applying the rule for the MRC tool to identify the first set of shape occurrences from the filtered mask-pattern-description which match the first shape.

13. The non-transitory computer-readable storage medium of claim 11, wherein identifying the second set of shape occurrences from the first mask-pattern-description comprises applying the rule for the MRC tool to identify the second set of shape occurrences from the first mask-pattern-description which match the first shape.

14. The non-transitory computer-readable storage medium of claim 9, further comprising overlaying a graphical representation of the third set of shape occurrences with a graphical representation of the first mask-pattern-description to indicate shape occurrences in the first mask-pattern-description which have been fractured differently than the fractured-shape instantiation.

15. The non-transitory computer-readable storage medium of claim 9, wherein the method further comprises generating an indicator which indicates how uniformly the first shape has been fractured in the first mask-pattern-description.

16. The non-transitory computer-readable storage medium of claim 15, wherein the indicator is one of: the number of shape occurrences in the third set of shape occurrences, and the percentage of shape occurrences in the second set of shape occurrences which have a corresponding shape occurrence in the third set of shape occurrences.

17. An apparatus for detecting an occurrence of a shape which has been fractured into a configuration of primitive shapes which is different from a desired configuration, comprising:
  a selection mechanism configured to select a fractured-shape instantiation in a first mask-pattern-description, wherein the fractured-shape instantiation represents a fracturing of a first shape, wherein the fractured-shape instantiation comprises a set of primitive shapes which are arranged in a particular configuration, and wherein the first mask-pattern-description comprises multiple occurrences of the first shape;
  a primitive shape filter configured to generate a filtered mask-pattern-description which includes identified primitive shapes in the first mask-pattern-description, wherein each primitive shape in the identified primitive shapes matches at least one primitive shape in the set of primitive shapes;
  a prototype shape filter configured to:
    identify a first set of shape occurrences from the filtered mask-pattern-description, wherein each shape occurrence in the first set of shape occurrences matches the first shape; and
    identify a second set of shape occurrences from the first mask-pattern-description, wherein each shape occurrence in the second set of shape occurrences matches the first shape; and
  a comparison mechanism configured to generate a third set of shape occurrences, wherein the third set of shape occurrences includes:
    shape occurrences from the first set of shape occurrences which are not in the second set of shape occurrences, and
    shape occurrences from the second set of shape occurrences which are not in the first set of shape occurrences;
  wherein the third set of shape occurrences facilitates identifying occurrences of the first shape which have been fractured differently than the fractured-shape instantiation.

18. The apparatus of claim 17, wherein generating the filtered mask-pattern-description comprises:
  generating a selection rule based on the fractured-shape instantiation, wherein the selection rule uses dimensional information to help identify primitive shapes in the set of primitive shapes; and
  applying the selection rule to the first mask-pattern-description to obtain the filtered mask-pattern-description.

19. The apparatus of claim 17, wherein identifying the first set of shape occurrences from the filtered mask-pattern-description comprises generating a rule for a manufacturing rule check (MRC) tool based on the first shape.

20. The apparatus of claim 19, wherein identifying the first set of shape occurrences from the filtered mask-pattern-description further comprises applying the rule for the MRC tool to identify the first set of shape occurrences from the filtered mask-pattern-description which match the first shape.

21. The apparatus of claim 19, wherein identifying the second set of shape occurrences from the first mask-pattern-description comprises applying the rule for the MRC tool to identify the second set of shape occurrences from the first mask-pattern-description which match the first shape.

22. The apparatus of claim 17, further comprising an overlay mechanism configured to overlay a graphical representation of the third set of shape occurrences with a graphical representation of the first mask-pattern-description to indicate shape occurrences in the first mask-pattern-description which have been fractured differently than the fractured-shape instantiation.

23. The apparatus of claim 17, wherein the comparator mechanism is further configured to generate an indicator which indicates how uniformly the first shape has been fractured in the first mask-pattern-description.

24. The apparatus of claim 23, wherein the indicator is one of: the number of shape occurrences in the third set of shape occurrences, and the percentage of shape occurrences in the second set of shape occurrences which have a corresponding shape occurrence in the third set of shape occurrences.

* * * * *